United States Patent [19]
Allen et al.

[11] Patent Number: 4,664,309
[45] Date of Patent: May 12, 1987

[54] CHIP MOUNTING DEVICE

[75] Inventors: Leslie J. Allen, Swindon, England; Gabe Cherian, Fremont; Stephen H. Diaz, Los Altos, both of Calif.

[73] Assignee: Raychem Corporation, Menlo Park, Calif.

[21] Appl. No.: 509,684

[22] Filed: Jun. 30, 1983

[51] Int. Cl.[4] .............. H01L 21/58; B23K 1/12
[52] U.S. Cl. ................ 228/180.2; 228/56.3; 228/175; 228/249; 228/248; 339/17 M
[58] Field of Search ............ 29/589; 228/56, 170, 228/173 R, 180.2, 248, 175, 249; 339/17 M, 17 CF, DIG. 3

[56] References Cited

U.S. PATENT DOCUMENTS

| | | | |
|---|---|---|---|
| 3,070,650 | 12/1962 | Stearns | 339/275 B |
| 3,148,310 | 9/1964 | Feldman | 174/845 |
| 3,373,481 | 3/1968 | Lins et al. | 228/180.2 |
| 3,467,765 | 9/1969 | Croft | 174/94 R |
| 3,472,365 | 10/1969 | Tiedema | 228/56 |
| 3,591,839 | 7/1971 | Evans | 29/589 |
| 3,616,532 | 11/1971 | Beck | 29/625 |
| 3,680,037 | 7/1972 | Nellis et al. | 339/DIG. 3 |
| 3,795,884 | 3/1974 | Kotaka | 339/17 LM |
| 3,811,186 | 5/1974 | Larnerd et al. | 339/17 C |
| 3,839,727 | 10/1974 | Herdzik et al. | 357/71 |
| 3,861,135 | 1/1975 | Seeger, Jr. et al. | 174/88 R |
| 3,862,791 | 1/1975 | Miller . | |
| 3,871,015 | 3/1975 | Lin et al. | 29/589 |
| 3,900,153 | 8/1975 | Beerwerth et al. | 228/249 |
| 3,926,360 | 12/1975 | Moister | 228/180.2 |
| 3,991,463 | 11/1976 | Squitieri et al. | 339/17 M |
| 4,003,621 | 1/1977 | Lamp | 339/DIG. 3 |
| 4,027,936 | 6/1977 | Nemoto et al. | 339/DIG. 3 |
| 4,064,623 | 12/1977 | Moore | 339/DIG. 3 |
| 4,067,104 | 1/1978 | Tracy | 228/185 |
| 4,089,575 | 5/1978 | Grabbe | 339/17 CF |
| 4,109,378 | 8/1978 | Davies | 339/17 M X |
| 4,130,327 | 12/1978 | Spaulding | 339/17 CF |
| 4,179,802 | 12/1979 | Joshi et al. | 29/589 |
| 4,195,193 | 3/1980 | Grabbe et al. | 174/52 FP |
| 4,201,435 | 5/1980 | Nakamura et al. | 339/17 M |
| 4,209,893 | 7/1980 | Dyce et al. | 228/56.3 |
| 4,240,198 | 12/1980 | Alonso | 29/876 |
| 4,290,195 | 9/1981 | Rippere | 29/837 |
| 4,295,700 | 10/1981 | Sado | 339/DIG. 3 |
| 4,334,727 | 6/1982 | Scheingold et al. | 339/17 CF |
| 4,354,629 | 10/1982 | Grassauer et al. | 228/56 |
| 4,390,220 | 6/1983 | Benasutti | 339/17 CF |
| 4,402,450 | 9/1983 | Abraham et al. | 228/170 |
| 4,402,562 | 9/1983 | Sado | 339/DIG. 3 |
| 4,412,642 | 11/1983 | Fisher | 228/173 R |
| 4,458,968 | 7/1984 | Madden | 339/17 CF |

FOREIGN PATENT DOCUMENTS

| | | | |
|---|---|---|---|
| 0083436 | 12/1982 | European Pat. Off. . | |
| 55-53431 | 4/1980 | Japan | 29/589 |
| 55-61032 | 5/1980 | Japan | 29/589 |
| 1481015 | 6/1974 | United Kingdom . | |
| 2113134A | 12/1981 | United Kingdom . | |
| 2033283B | 12/1982 | United Kingdom . | |
| 2117686A | 3/1983 | United Kingdom . | |

OTHER PUBLICATIONS

*A Guide to Preform Soldering*, Alloys Unlimited Inc. 1959.
"Conductive Elastomeric Connector", Data Sheet CEC-011, 1974, Technical Wire Products, Inc.

*Primary Examiner*—Kenneth J. Ramsey
*Attorney, Agent, or Firm*—T. Gene Dillahunty; Herbert G. Burkard

[57] ABSTRACT

A chip mounting device which is hereinafter also referred to as an "interconnection preform placement device", includes a retaining member having a predefined pattern of holes in which are positioned preforms of joint-forming material such as solder. Each preform is of a predefined configuration and has a height or length greater than is cross-sectional dimension. The preform retains its general configuration after the interconnection or soldering process to form a resilient joint which is more capable of withstanding stress, strain and fatigue. A method of forming resilient interconnections comprises placing the interconnection preform placement device between parallel patterns of electrically conductive elements, such as the conductive pads on an electronic component and a circuit board, and effecting the bonding of the conductive elements with the preforms.

45 Claims, 16 Drawing Figures

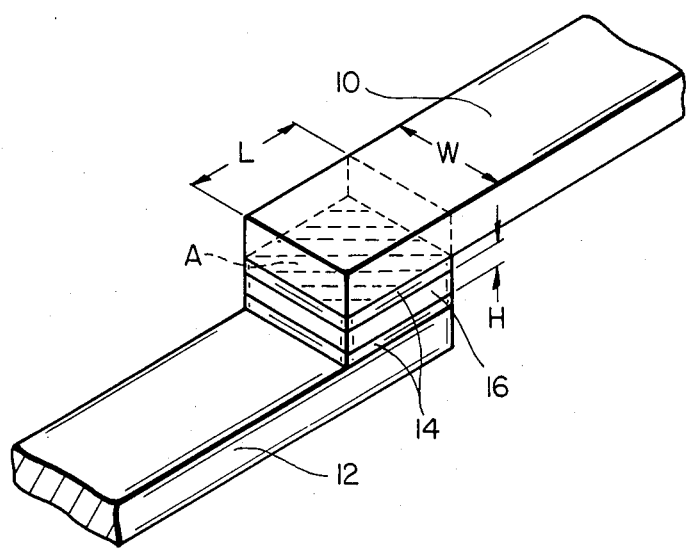
FIG_1
(PRIOR ART)
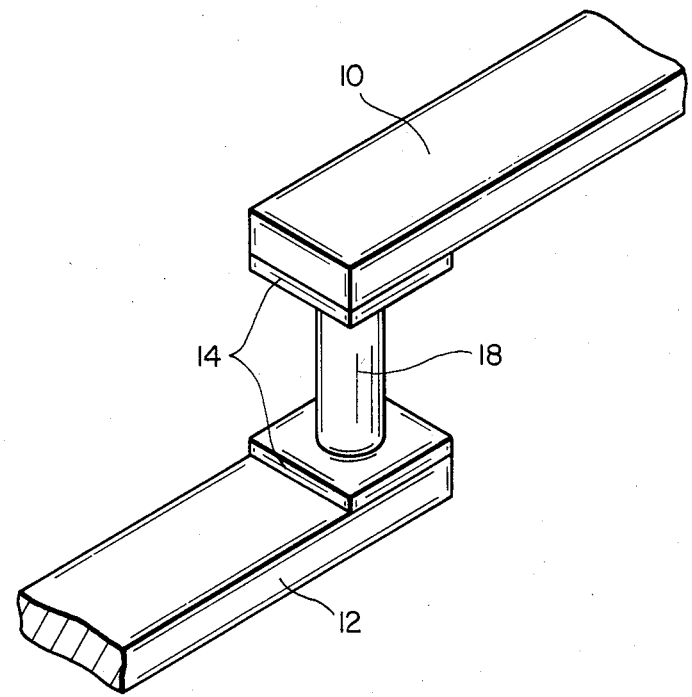
FIG_2

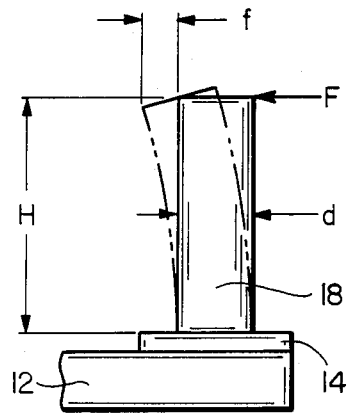
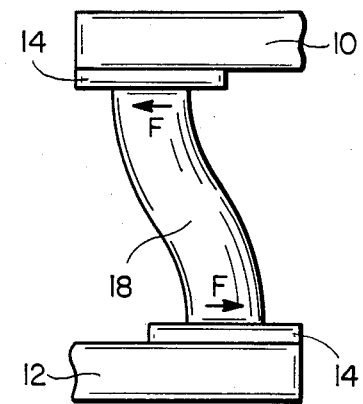
FIG_3A    FIG_3B
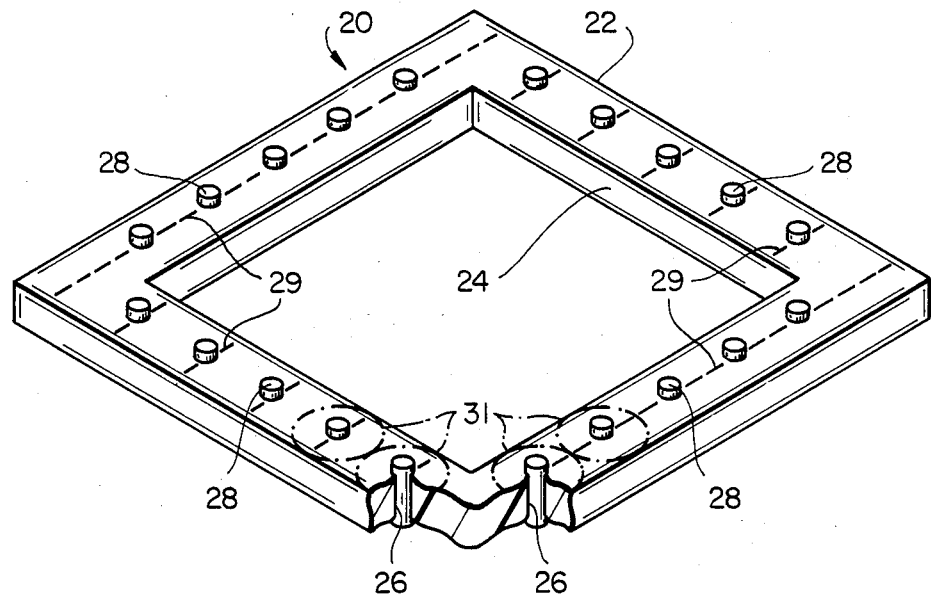
FIG_4

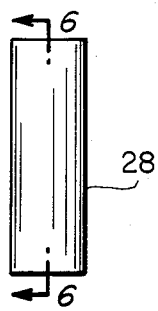
FIG_5
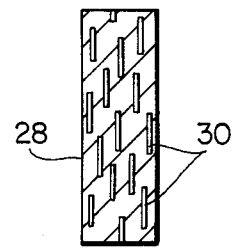
FIG_6
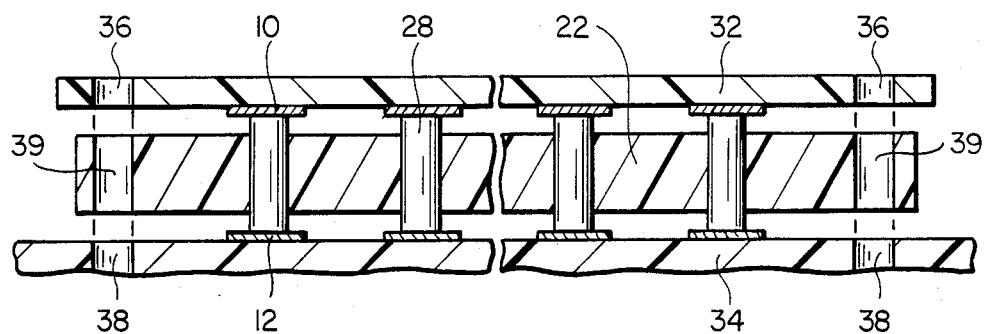
FIG_7
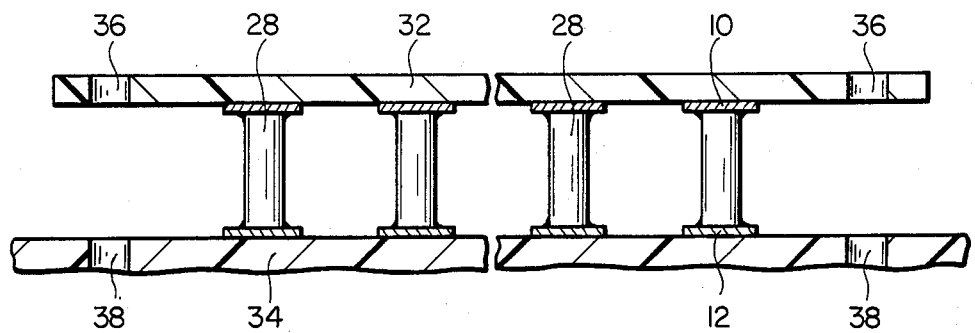
FIG_8

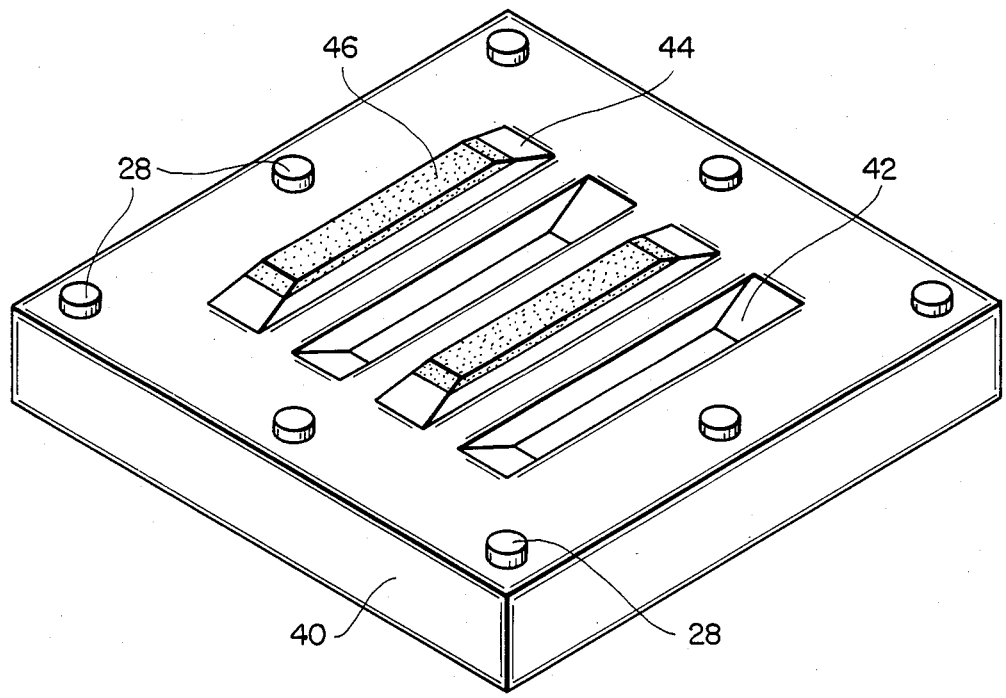
FIG_9
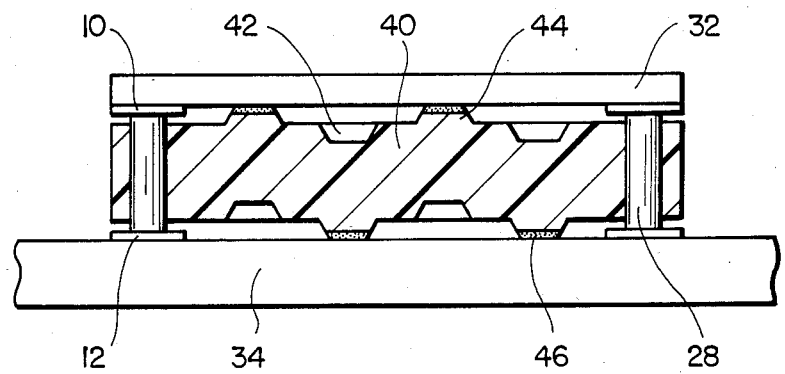
FIG_10

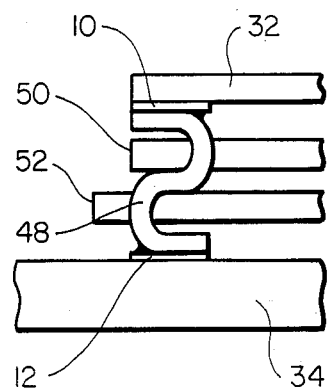
FIG_11A
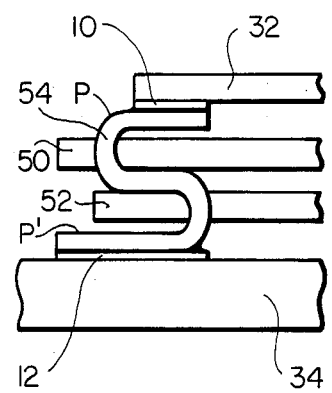
FIG_11B
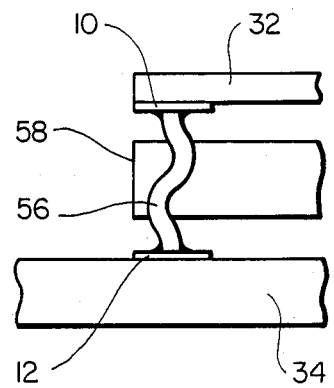
FIG_11C
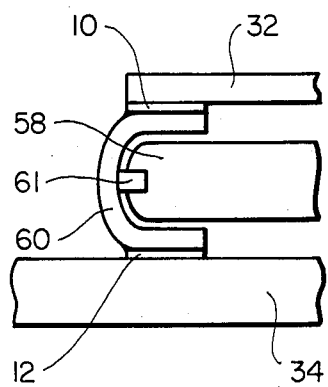
FIG_12
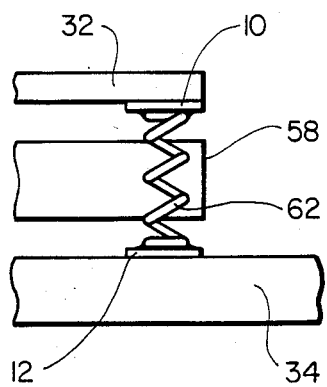
FIG_13

4,664,309

CHIP MOUNTING DEVICE

BACKGROUND OF THE INVENTION

This invention relates to electrical interconnections, and to methods and apparatuses for forming such interconnections. More particularly, the invention is directed to a method and apparatus for attaching electronic components, especially chips or chip carrier packages, to supporting substrates, such as circuit boards.

The microelectronics industry is steadily moving toward the use of large chips and chip carrier packages (CCP) which have connection pads on the faces and/or edges. These are generally used where there are limitations with the use of dual inline packages (DIP). The number of connections on the most popular packages can range from 64 to 156. Chip carrier packages can be produced with leads attached (leaded) or they can be leadless.

Leaded CCPs can be soldered directly onto printed circuit boards (PCB) or printed wire boards (PWB). Leadless CCPs can be soldered onto ceramic boards or installed into connectors. However, with glass/epoxy printed circuit boards or printed wire boards, leadless CCPs are usually mounted into connectors which are in turn mounted on the PCBs because of the effect of the differential thermal expansion coefficients of the materials involved when subjected to temperature fluctuations. These connectors are complex to manufacture and costly to use.

As the CCP technology improves and their reliability increases, more emphasis is directed to soldering these packages directly onto the PCBs to make more use of the board space, and dispensing with the connectors even though the use of connectors permits replacement of faulty CCPs. The cost of conventional connectors relative to the cost of the CCPs can be disproportionately high. This is a strong incentive to use CCPs without connectors.

However, the direct soldering of the CCPs on PCBs without the use of connectors is associated with a number of problems. (1) The variation of the surface flatness and non-parallel contours between the CCP and the boards produces varying solder joint heights. (2) The solder will have a tendency to wick out of the joint area into crevices or castellations in the CCP, thus "starving" the joint area. (3) Gold alloying with the solder will produce embrittlement of the "starved" joint. (4) Differential thermal expansion between the CCP and the board will fracture a thin solder joint due to the high shear strains in the joint. (5) Bridging between joints may occur if excess solder is present or if the distance between the joints is small. (6) Solder location tolerances are small and getting smaller yet with increasing packaging density, with a typical connection pad having a width of 0.012 inches and a 0.022-inch center-to-center spacing. (7) Flux removal from the space between the CCP and the PCB and subsequent inspection thereof. (8) The solder pastes used to attach the CCP will produce loose solder balls which cause electrical problems.

Problems (1) through (4) and problems (7) and (8) can be substantially overcome by introducing tall columns of solder or similar joint-forming material to form each joint. This provides a "solder-rich" condition which minimizes the gold alloying effect, provides excess solder to accommodate surface irregularities and non-flatness, the tall solder columns will have lower shear, bending and/or combined stress and strain proportional to their greatest height, and no solder balls will be created. Problems (5) and (6) require the precise control of solder quantity and location.

Different solutions have been proposed for the foregoing problems. The proper positioning of a predetermined quantity of solder may be achieved with the use of solder preforms spaced on a carrier or template in the locations corresponding to the points where the solder joint are to be formed. Examples of this technique may be found in U.S. Pat. Nos. 3,320,658, issued to Bolda et al; 3,396,894, issued to Ellis; 3,472,365, issued to Tiedema; 3,719,981, issued to Steitz; 3,744,129, issued to Dewey; 4,209,893, issued to Dyce et al.; and 4,216,350, issued to Reid.

Dyce et al. and Reid relate more specifically to the use of ring-type solder preforms for the solder connection of pin-type joints. The solder preforms of Dewey are hollow cylinders. Tiedema relates to a flexible carrier ribbon having spaced apertures which receive solder discs to provide a convenient means to handle and transport solder discs.

The Ellis patent discloses a device for simultaneously applying a plurality of solder or other bodies of heat-fusible material, in which the solder bodies are disposed in heat-recoverable cups formed from or positioned on a sheet of material. The cups are spaced to correspond to the location of solder application, and, when heat is applied to the device, the solder melts and the cups recover to a flat configuration, and the recovering cup material forces the solder material out therefrom and into contact with the elements to be soldered.

The Bolda et al. patent provides a thermoplastic carrier sheet onto which a plurality of conductive elements, such as solder preform spheres, are positioned. The individual conductive elements are heated to a temperature which is sufficient to soften the carrier material, but insufficient to deform the conductive elements. During the heating process, the conductive element nestles in the softened thermoplastic material and, upon removal of the heat, the carrier material resolidifies and rigidly supports the conductive elements. When the solder ball carrier assembly is used, heat is applied to melt the solder ball and soften the thermoplastic carrier material, permitting the material to form an insulation between those portions of the electrical conductors not electrically interconnected by the solder elements.

Another approach has been proposed by Bell Laboratories which is developing techniques employing vacuum equipment to pick up and place small solder balls on the underside of the CCPs, and retaining them by using a solid phase bonding method. Additional information may be found in the paper by R. H. Minetti entitled "Solid Phase Solder Bonding for Use in the Assembly of Microelectronic Circuits."

Steitz provides a method of joining solder balls to solder bumps spaced on a semiconductor flip chip by forming an array of solder balls on the tacky side of a pressure-sensitive tape, with the balls being spaced like the solder bumps. The array of solder balls is placed in contact with the solder bumps, and both are then heated to reflow the solder and cooled to fix the contacts after which the tape is removed.

In U.S. Pat. No. 3,614,832, Chance et al. form connections between the contacts on a solid-state device and conductive lands on a substrate by placing a decal over the device, the decal having a plurality of conductive strips attached adhesively to a backing sheet. Application of heat and pressure effects bonding of the strips, after which the adhesive is dissolved and the decal removed.

Although the foregoing techniques provide for the correct placement of a predetermined quantity of solder or other suitable joint-forming material, and with the proper dimensioning of the carrier or template, sufficiently small quantities of solder can be positioned on close spacing between centers, these proposals do not address the problem of high shear strains in the solder joints.

As noted above, among the factors considered in forming acceptable electrical connections between the CCP and the PCB is that the connections must be able to withstand stresses developed due to the effect of temperature fluctuations and the differences in thermal expansion coefficients between the material of the CCP and the substrate or circuit board on which it is mounted. Thus, a CCP may be made of a ceramic material and the circuit board may be made of an epoxy-glass composition, and when subjected to elevated temperatures these elements will expand at different rates, inducing stresses in the connections.

Even if the materials used in the CCP and the circuit board have thermal expansion coefficients which are close in value to minimize the differential expansion effects, heating/cooling cycles which result when power is applied across the CCP induce a temperature differential between the CCP and the PCB to produce stresses in the joints.

It is well known, and as summarized below, that if the solder joint is formed into a "long" column configuration in which the height of the column is much greater than the diameter or transverse dimension of the joint, less stress is induced in the joint and consequently the joint has greater reliability and longer life.

A common deficiency of the solder connections described in the foregoing references is that the height of the joint is smaller than its width or diameter, and the height is significantly smaller than the center-to-center distance between consecutive joints. This is true since the joints are formed from free solder preforms in a variety of shapes. None of these preforms can sustain a column-type shape after melting and during the soldering process due to the low strength and viscosity and high surface tension of molten solder. These joints contrast with the present invention in which the height of the resultant joints is greater than the transverse dimension of the solder joints.

In the patent to Krall, U.S. Pat. No. 3,921,285, a method is described for joining microminiature components to a carrying structure in which the height of the electrical connections may be adjusted during original joining of the component to the carrying structure or in a two-step solder reflow process. The method involves the elongation of the solder joints between the component and its carrier, and is accomplished by the use of a vaporizable material which is either liquid at room temperature or becomes liquid before the solder melts. A bridge is positioned over the component and the vaporizable material is placed between the bridge and the component surface opposite the surface on which the connections are formed. Heating to achieve soldering causes the material to vaporize, and the combined action of vaporization and surface tension pulls the component closer to the bridge, which in turn elongates the solder joint. Upon cooling the joint remains fixed in its elongated shape.

While Krall provides for elongated solder joints, the device is structurally complex and difficult to use. Specifically, an additional lifting structure is required to operate while the solder is in a molten state. If the motion of the lifting device is too great, or if the solder quantities are not uniform, then some solder joints may be ruptured. Additionally, the lifting structure is an obstacle to cleaning and inspection. Finally, this method will function only when the ratio of solder column height to diameter is relatively small.

OBJECTS OF THE INVENTION

It is a primary object of the present invention to provide an apparatus and a method for the precise placement of a predetermined quantity of material for the formation of a solder-type connection between electrically-conductive elements.

Another object of the invention is to provide an apparatus and a method of the foregoing type for the placement of a connection-forming material having a predefined configuration.

Another object of the invention is to provide an apparatus and a method of the foregoing type for the placement of a connection-forming material preform having a height dimension greater than its transverse dimension.

Yet another object of the invention is to provide an apparatus and a method of the foregoing type for the formation of solder-type connections which are resilient and better able to withstand fatigue or repetitive thermal cycling.

Still another object of the invention is to provide an apparatus and a method of the foregoing type for the simultaneous formation of a plurality of resilient solder-type connections between a plurality of parallel-disposed electrically-conductive elements.

A further object of the invention is to provide an apparatus and a method to attach an electronic component to a circuit board.

Yet a further object of the invention is to accurately align the CCP with the PWB.

A specific object of the present invention is to provide an apparatus and a method to attach an electronic component to a circuit board with resilient solder joints having a height/length dimension greater than the transverse dimension which are better able to withstand thermal cycling/fatigue stresses and to accommodate dimensional irregularities in the component, the circuit board and the conductive elements thereon.

SUMMARY OF THE INVENTION

The foregoing and other objects are achieved by the interconnection preform placement device of the present invention which includes a retaining member having a predefined pattern of holes in which are positioned preforms of joint-forming material, such as solder. Each preform is of a predefined configuration and has a height greater than its cross-sectional dimension. The preform retains its configuration after the interconnection or soldering process to form a resilient joint which is more capable of withstanding stress, strain and fatigue.

The method comprises placing the interconnection preform placement device between parallel patterns of electrically-conductive elements, such as the conductive pads on an electronic component and those on a circuit board, and effecting the bonding and interconnection of the conductive elements with the preforms.

The preferred preform configuration is a slender column, but other shapes are encompassed within the invention, and the preforms may be reinforced with suitable material disposed therein. The preform carrier may be left in the assembled mounting, or it may be designed to be removed afterwards. The preform carrier may be left in the assembled mounting to perform a structural, thermal and/or electrical function.

BRIEF DESCRIPTION OF THE DRAWINGS

The above description, as well as further objects, features and advantages of the present invention, will be more fully appreciated by reference to the following description of presently-preferred but nonetheless illustrative embodiments in accordance with the present invention, when considered in connection with the accompanying drawings, in which:

FIG. 1 labeled Prior Art, represents, on an enlarged scale, a solder joint between a chip device and a circuit board formed in accordance with existing techniques;

FIG. 2 is a showing similar to FIG. 1, illustrating a joint formed with the column-type connection;

FIG. 3A is a representation of the column of FIG. 2 as a cantilevered beam fixed at one end and showing the force acting on it for the purposes of considering the resultant displacement and stresses;

FIG. 3B is a representation of the column of FIG. 2 as a beam fixed at one end and guided at the other and deformed as a result of the relative movement of its ends;

FIG. 4 is a perspective view of one embodiment of the present invention showing a plurality of column-type solder preforms mounted on a retaining member in the form of a perimeter type carrier element;

FIG. 5 is an elevational view showing one of the column preforms illustrated in FIG. 4;

FIG. 6 is a cross-sectional view along line 6—6 in FIG. 5 showing a column preform reinforced to preserve its column-type shape;

FIG. 7 is an elevational cross-section showing the preform placement device of FIG. 4 positioned between the structures to be joined, prior to the soldering of the connections;

FIG. 8 is a showing as in FIG. 7, after the solder connections have been formed and the preform placement device has been removed;

FIG. 9 shows another embodiment of the present invention;

FIG. 10 is an elevational view, in section, showing the placement device of FIG. 9 in position after the solder joints have been formed;

FIGS. 11A–C show alternative configurations of the solder preforms useable in connection with the present invention; and FIGS. 12 and 13 show additional configurations for the solder preforms.

DESCRIPTION OF THE PREFERRED EMBODIMENTS

In the description herein, the solder joining of a chip carrier package, which is referred to hereafter as a "chip device" or a "chip carrier", and a circuit board is used as an illustrative application of the present invention. The joining of other electronic components is also comprehended, and the invention may be employed wherever and whenever a solder connection of increased reliability and longer life is desired.

Referring to the drawings, and more particularly to FIG. 1, a joint or connection made in accordance with techniques known in the prior art is shown formed between a chip device 10 and a circuit board 12. The chip device 10 has a plurality of electrical contacts which may be disposed along its edge. Only one contact area is shown for the sake of simplicity. The circuit board 12 has a plurality of complementary contact areas on its surface (only one shown). The circuit board 12 may be a printed circuit board (PCB) or a printed wire board (PWB), and may be referred to hereinafter simply as a "board" or "circuit board." In a known fashion, the chip device will be disposed above the surface of the circuit board such that the contact areas are vertically aligned and mechanically and/or electrically joined, such as with a solder connection. In the illustration of FIG. 1, the opposed, facing surface of the chip device 10 and the circuit board 12 is provided with a layer 14 of conductive material, such as copper, and these layers are interconnected with a suitable solder composition 16, which may be of known tin-lead alloy.

As noted above, a solder connection such as shown in FIG. 1 is subjected to stresses induced by thermal and mechanical forces. These stresses are the result of strains produced by mechanical deformation, differences in temperature between the chip device and the printed circuit board and/or differences in the thermal coefficients of expansion between the chip device and the PCB. For example, thermal stresses may result from power cycling even when the materials of the chip device and circuit board do not exhibit any differences in the coefficient of thermal expansion, but because of the power applied to the chip device, a temperature differential exists between the chip device and the circuit board.

It can be seen that as the connection is subjected to repeated heating and cooling cycles, it will ultimately fail due to fatigue, and the connection will fail earlier if the stresses induced therein are high. Therefore, to prolong the life of the joint and to increase its reliability, the resultant stresses therein should be reduced. In order to determine how the stresses can be reduced, the factors governing the creation of the stresses in the joint should be considered.

When the temperature of a CCP mounted on a PWB is raised by $\Delta T$, the length of the CCP increases by the amount $\delta_c$ $$\delta_c = L_c \cdot \alpha_c \cdot \Delta T \tag{1}$$

and the length of the PWB increases by an amount $$\delta_B = L_B \cdot \alpha_B \cdot \Delta T \tag{2}$$

where
$L_C$ = Original length of the CCP
$L_B$ = Original length of the PWB
$\alpha_c$ = Thermal coefficient of expansion of the CCP material
$\alpha_B$ = Thermal coefficient of expansion of the PWB material.

The difference between $\delta_B$ and $\delta_C$ is the net change in length between the CCP and the PWB due to the $\Delta T$ and is defined as $\delta$.

$$\delta = \delta_B - \delta_C \tag{3}$$

-continued $$= L_B \cdot \alpha_B \cdot \Delta T - L_C \cdot \alpha_C \cdot \Delta T$$

So $$\delta = L \cdot \Delta T (\alpha_B - \alpha_C) \tag{4}$$

since $L_B = L_C$.

This change in length between the CCP and the PWB is usually accompanied by an internal force F which causes an elastic/plastic deformation in the three main elements of the assembly, i.e., the CCP, the PWB and the interconnections. It is known to those skilled in the art that if all three of these elements are very stiff then the force F will, of necessity, be high and potentially destructive. It is similarly known that if the stiffness of the interconnections can be reduced (i.e., made more flexible), then there will be a concommittant reduction in the peak force F for any given value of $\delta$.

The stiffness of the various joint element designs may be approximated as follows:

By definition stiffness is $K = F/f$
where
F = Applied force
f = Deflection
K = Constant of stiffness If H is small, as in the prior art jointing methods illustrated in FIG. 1, then the joint stiffness is:

$$K = GA/H$$

where
G = Shear modulus of elasticity
A = Joint area
H = Height of the joint

From this expression it is evident that to reduce the stiffness K of the prior art joint, it is necessary to decrease the area of connection A or the shear modulus of elasticity G or to increase the height H.

The shear stress $\sigma$ in the joint may be expressed;

$$\sigma = F/A \tag{5}$$

so if the area of the joint A were decreased to reduce the stiffness, this would simultaneously increase the stress proportionally, as shown by equation (5). Increasing the area of the joint is not generally beneficial and, of course, this strategy would take additional space, thus defeating the primary goal of this type of package, i.e., closer lead spacing.

Increase in the joint height, however, has the benefit of lower joint stiffness, without an increase in stress.

A more detailed consideration of joints with a larger H dimension, as shown in FIG. 2, will now be undertaken.

If the height H between the opposed surfaces of the conductive paths, such as 10 and 12 in FIG. 1, is relatively large, then the resultant critical stresses are due to bending deformation of the joint. This can be represented as shown in FIG. 2 wherein the joint between the contact 10 and the conductive land 12 is represented by a column 18 of solder. The stresses in the joint can be evaluated by considering the column as a cantilevered beam, fixed at one end, such as to the conductive land 12, with the force F, again assumed to be constant, acting transversely upon the free end of the column.

The deflection f at the tip of the beam and the bending stress $\sigma_b$ are given by the well-known equations:

$$f = FH^3/(3EI) \tag{2}$$

$$\sigma_b = FH/Z \tag{3}$$

For a round beam, or a round column, the relationship between the section modulus Z and the moment of inertia I is:

$$Z = I/c = 2I/d \tag{4}$$

where $$I = \pi d^4/64 \tag{5}$$

where d is the diameter. The section modulus Z then is:

$$Z = \pi d^3/32 \tag{6}$$

Substitution of equation (5) into equation (2) results in the deflection equation (7) below, and substitution of equation (6) into equation (3) yields the stress equation (8) below:

$$f = (64FH^3)/(3\pi Ed^4) \tag{7}$$

$$\sigma T_b = (32FH)/\pi d^3 \tag{8}$$

The force F in FIG. 3A is produced as the result of dimensional expansion or contraction of the joint due to the thermal cycling, which is represented by the deflection f in equation (7) above. Then, to get the relationship between the deflection and the stress, equations (7) and (8) can be combined as follows:

$$F = (3\pi EdE^4 f)/64 \, H^3 \tag{9}$$

$$\sigma_b = 3 \, Edf/2 \, H^2 \tag{10}$$

From the relationship of the stress $\sigma_b$ given in equation (10) above, it can be seen that in order to reduce this stress, the value of the numerator should be reduced, principally by using a smaller value for d, i.e., decreasing the diameter of the cylindrical column; or by reducing E, i.e., using a more flexible joint material; or by increasing the value of the denominator, such as by increasing the height H of the column. Since the height H is squared, an increase in this parameter from one value to twice that value reduces the stresses in the column to one fourth of the initial level. This indicates that the height H need not be drastically increased in order to get an appreciable reduction in the stresses in the column.

Additionally, by using a somewhat higher column of smaller diameter, not only are the resultant stresses therein reduced, but this permits higher density of joints between the chip devices and the circuit board, a result which is very desirable for increased packing density.

A more rigorous and more exact representation of the deflection of the column shown in FIG. 2 is shown in FIG. 3B, in which one end of the column is fixed and the other end is guided. In this situation, the following relationships exist for the deflections f, and the stresses $\sigma_g$ at each of the two ends and at the center of the beam:

$$f = FH^3/(12EI) \tag{11}$$

$$\sigma_g = FH/2Z \quad \text{at ends} \tag{12}$$

$$\sigma_g = 0 \quad \text{at center} \tag{13}$$

Rearranging equations (11), (12) and (13) in the same manner as done previously, the following relationships are obtained for the force F acting on the joint and the stress $\sigma_g$:

$$F = (12EIf)/H^3 \tag{14}$$

$$\sigma_g = (6Edf)/H^2 = 4(\sigma_b) \tag{15}$$

From equation (15), it can be seen that the stress is four tims larger than if the connection is considered as a simple cantilevered beam (equation 10). However, the diameter of the beam d and the modulus of elasticity E are still in the numerator, and the height H is squared and appears in the denominator, which is identical to the stress given by the equation (10). Thus, the stress relationship derived from the more rigorous model of the joint still supports the above conclusions.

Furthermore, from equation (13) it can be seen that at the center of the column there are no bending stresses. Consequently, a column-type joint, with varying diameters, such that the diameter at the cenfter of the column is smaller than the diameter at both ends (i.e., like an hourglass), would be more uniformly stressed and would provide greater flexibility.

A more detailed finite element analysis of similar joint structures was presented by E. A. Wilson, Honeywell, Phoenix, Ariz., and E. P. Anderson, Honeywell, Bloomington, Minn., in their paper entitled "An Analytical Investigation into Geometric Influence on Integrated Circuit Bump Strain," which was presented at the 33rd Electronic Components Conference, May 16-18, 1983, In Orlando, Fla. (*Proceedings* page 320-327), incorporated by reference herein. This analysis confirms the advantages of columnar structures.

It is understood that by reducing the peak stresses as described above in a repetitive loading situation, the number of cycles required to produce failure is greatly increased.

From the foregoing evaluations, it can be seen that the life of the solder joints can be increased substantially by a relatively small increase in solder joint height. Likewise, a reduction in solder joint diameter will extend the life of the solder joints. A concomittant advantage in using joints of increased height and/or reduced diameter is the opportunity for increased packing density.

The foregoing advantages of reduced stresses and extended life in the solder joints and the opportunity for increased packing density are incorporated in the present invention which provides a device for the precise positioning of solder preform of slender cylindrical shapes at predefined locations. In the embodiment of the invention illustrated in FIG. 4, the interconnection preform placement device 20 includes a retaining member 22 of electrically nonconductive material having a configuration and size substantially the same as the chip carrier for which the preform placement device is used in mounting the chip carrier on a suitable substrate, such as a circuit board. The holder 22 has a cenftral cut-out 24 to form a perimeter or bordering portion in which are spaced at predetermined locations a plurality of holes 26 which receive preforms 28 of solder in the shape of slender cylindrical columns, such as shown in FIG. 5. The retaining member may also hereinafter be referred to as a "holder."

The location and positioning of the holes 26 on the retaining member 22 are determined by the spacing of the conductive contacts disposed on the edge of the chip carrier to be mounted. Generally, the height of each solder preform 28 will be somewhat taller than the thickness of the retaining member 22 such that the upper and lower edge portions of each solder preform 28 will extend above the corresponding surfaces of the retaining member, and in use these exposed surfaces will make physical contact with the corresponding conductive pads on the chip carrier and on the circuit board.

While not specifically shown in FIG. 4, the preform placement device is provided with appropriate means for properly locating and orienting the retaining member 22 with respect to the chip carrier and the circuit board so that the conductive pads on the chip carrier, the conductive pads on the circuit board and the column solder preforms are properly aligned. Such locating means are known, and may include a chamfered corner which mates with a similarly-configured surface on the chip carrier. One or more of the corners may have an indexing notch. Additionally, two pine may be provided on the bottom surface of the retaining member 22, or two holes to accept two pins which register with positioning holes provided on the circuit board. A combination of such positioning techniques may be incorporated into the holder 22.

It is possible to vary the composition of the solder material such that the solder preform has a consistency which will give or compress under the weight of the chip carrier to be mounted. This compressibility of the solder preform is important because the chip carrier and the circuit board are typically not truly flat so that the lengths of the solder columns must change during the soldering process to accommodate these irregularities.

The retaining member 22 may be made from any suitable material, and preferably is of an electrically-nonconductive material. The material may be a single sheet or layer of desired thickness, or may be a laminate of a plurality of thin sheets or layers of suitable material or may be a plurality of elements which form a sheet-like structure. Such material would include, but is not limited to, glass matt and high-temperature polymeric materials such as Ultem TM *. The material of the retaining member 22 should be sufficiently rigid and temperature-resistant to maintain the solder preform's position during the soldering process.

*Ultem is a trademark of General Electric Company.

Preferably there are two categories of retaining members, those that are removable and those that become a permanent part of the interconnection. The removable type could be dissolvable, frangible, segmented, or deformable without harming the preforms. The permanent or nonremovable type can be passive or can perform electrical, mechanical and/or thermal functions. The removable type can therefore be destroyed by dissolving or breaking apart. The glass matt embodiment can be physically pulled away in whole or piece by piece. The Ultem TM embodiment can be dissolved by well-known chemical means without harming the preform.

It is within the scope of the invention to make a segmented retaining member that can be stripped away after interconnection. The retaining member 22 in FIG. 4 can be provided with lines of weakness or cuts as shown at 29 in phantom line. In this way, the retaining member 22 may be removed in one or more pieces and directions. The retaining member may also originally be made from individual elements as will be discussed later.

Thus it can be seen that the removable retaining member may also be conductive such as an aluminum foil in order to maintain the position of the preforms during interconnection. It is important that such a retaining member not bond to the preforms during the process.

Finally, the retaining member can be made from a thin sheet of solder material which could melt and flow into the solder-like preforms during the soldering process.

The retaining member which remains in place should be generally nonconductive and relatively flexible so that it does not interfere with the motion of the preform columns. Additionally, it may provide an impedance-matched interconnection if it is a combination of conductive and dielectric materials so that it provides a transmission line or microstrip effect, or a coaxial type shield around the preforms.

In another embodiment the retaining member could be made from a nonconductive material which, however, becomes conductive when a specific voltage threshold is exceeded, this threshold being just above the normal operating voltage of the circuit. This type of retaining member would provide protection to the chip device by shorting out any potentially damaging transient overvoltages which may result from electrostatic discharge or other electrical faults.

In some applications, it may be desirable to make the retaining member from a material which exhibits heat-recovery. This type of retaining member could be reinforced with glass fiber or the like to control its coefficient of thermal expansion but locally the holes which are provided for retaining the solder-like columns could be fabricated so as to contract in diameter during soldering and thereby extrude the solder column up to meet the CCP and PWB.

Although the retaining member has been shown to position only interconnection preforms in FIGS. 4 and 7-10, it is understood that other elements could also be positioned by the retaining member and attached to the chip device and board. A heat-sink device could be carried in the central opening of the retaining member of FIG. 4 and bonded to the CCP and PWB during soldering. Similarly, a vibration damper, structural reinforcement, or a Peltier-type cooler could be positioned and attached to the CCP and the PWB. Also, an electrical ground plane could be positioned near the interconnection preforms to beneficially modify their electronic impedance characteristics similar to a microstrip board trace.

FIG. 4 shows a square peripheral array of interconnections. However, other patterns or arrays could also be accomplished by this invention. Any nxm matrix of interconnections on a regular rectilinear format could be provided. Non-rectilinear or partially filled arrays could also be provided.

If the interconnections are arranged sufficiently close together, a random-type interconnection system could be produced. In this type of system, since the interconnection density is much higher than the density of the pads on the CCP and PWB, then statistically there will always be at least one interconnecting preform located between each pad set to be interconnected. The arrangement of the interconnections is completely random in this type of holder system. This type of retaining member may ideally be made from a plurality of elements bonded together, each having at least one aperture therethrough. The elements such as elements 31, shown in phantom in FIG. 4, may be of uniform or random cross-section in order that they may be efficiently bundled and permanently or temporarily joined together such as by fusion or proper adhesive material to form a sheet-like structure. In such a bundled configuration the retaining member elements may be formed by continuously extruding the retaining member material over the preform, cutting the extruded composite into discrete pieces, bundling the axially-aligned pieces and preferably joining the retaining member material and then slicing the assembly at right angles to the axial alignment to make a preform placement device.

Also shown in the configuration shown in FIG. 4, the retaining member 22 can be ideally stamped from a sheet of material, or otherwise cut from sheet material. Quite possibly the retaining member fabricating process would provide for the simultaneous stamping of the holder shape and the central cut-out 24 and formation of the properly-spaced holes 26, and insertion of the solder preforms into the holes. Of course, it is possible that the production of the retaining member 22 can be achieved in a sequence of steps in which the retaining member with its cut-out and orientation surfaces is stamped from a sheet material, and subsequent techniques are used to form the holes into which the solder preforms are inserted. Other manufacturing methods such as molding or insert molding are withining the scope of the invention.

The retaining member 22 may be fabricated from a sheet of a laminate of heat-recoverable material in which the retaining member is stamped from the material sheet, the holes formed therein, and the solder preforms position within the holes. Subsequently, the retaining member is heated to a temperature sufficient to cause the material to recover such that the diameters of the holes 26 are reduced, but at a temperature below the melting point of the solder preforms. The use of a heat-recoverable material for the retaining 22 affords the advantages that the holes can be formed to a predefined shape, such as an hourglass, with varying diameters, such that the diameter of the middle section is smaller than the diameter at the ends. These holes would be expanded to a uniform diameter larger than the diameter of the preforms so that the preforms can be more readily positioned in the holes, after which the retaining member 22 is heat-recovered, causing each hole to constrict to a size substantially identical to the diameter of the preform, thus securely gripping the preform within the retaining member. Furthermore, the use of a heat-recoverable material affords the advantage that in use, when heat is supplied to effect the solder joint, such as by a solder reflow process, the firm gripping of the solder preforms by the heat-recovered retaining member material will impart the original hourglass shape of the holes to the preform, thus improving the flexibility of the column-type joints, and in turn reducing the stresses and improving the reliability of the joints.

It is also possible to further control the ultimate configuration of the solder joint by the use of a heat-recoverable material in the retaining member 22. This can be achieved by partially recovering the material, causing the holes to securely grip the preforms. Then, during the soldering process, sufficient heat is applied to cause the material of the retaining member to further recover, thereby further decreasing the diameter of the holes to apply a constrictive force onto the molten or softened preform. This will have a tendency to produce column joints of height greater than the thickness of the retaining member 22.

While the retaining member 22 has been shown in FIG. 4 as a perimeter configuration, it is possible that the retaining member can be a layer of material without any cut-outs therein, and in which the necessary number of solder preforms are properly located throughout the entire surface of the retaining member as necessitated by the number, location and configuration of the conductive pads to be joined.

The solder preforms 28 may be made of any suitable material, such as a tin-lead alloy of appropriate composition or a conductive elastomer. The preforms can be produced by any suitable technique, such as by the continuous extrusion of the solder material through appropriate-sized dies and cutting the extrudate to the proper lengths. The preforms may be molded. To improve the mechanical strength of the preforms and help maintain the columnar configuration during the soldering process, particles of metallic or non-metallic material may be embedded in the solder preforms, such as shown in FIG. 6. For example, discrete pieces 30 of metallic material, such as pieces of copper, may be embedded in the solder preforms by mixing the particles in the composition prior to extrusion, and then extruding the mixture in a known fashion. As shown in FIG. 6, the discrete particles may be aligned along the longitudinal axis of the extrudate. This alignment can be achieved with appropriate techniques, such as the application of a magnetic force during the extrusion process, or simply by the shearing force applied by the extruder on the extruding material.

The particles mixed into the solder should have a melting point above the melting point of the solder, and good metallurgical, mechanical and electrical properties.

In addition to copper, discussed above, fillers could include nickel, iron, and metal-coated high-temperature polymer or glass films with a high aspect ratio. These materials could be discrete particles or continuous lengths with a single strand or many strands in each preform. These materials may also be a continuous strand of conductive material such as wire with filled or unfilled solder material located at the ends thereof for interconnection purposes as will be appreciated and discussed with respect to FIGS. 11-13. Solder could completely coat the strands or fibers, or could be deposited only at the ends of inherently conductive fibers. Additionally, the interconnection bonding agent or solder could be added in a separate operation. Thus, continuous conductors or fiber bundles could be retained by the retaining member and then attachment would be accomplished by immersing the assembly in molten solder which will wick and wet the components and make the electrical and mechanical interconnection.

Additionally, the particles may be oriented in any other desirable alignment, and the relative content of the particles in the solder preforms, as well as the size of the particles relative to the height of each preform, can be tailored to the requirements of the joints to be formed. Furthermore, the surfaces of the solder preforms may be coated with a suitable flux, or the flux may be coated only on the end portions of the preform so that during the soldering process the flux will coat the respective contact areas on the conductive pads to ensure proper flux of the solder. The flux may also be incorporated within the preform.

The use of the preform placement device 20 in mounting a chip carrier 32 to a suitable substrate, such as a circuit board 34, is illustrated in FIGS. 7 and 8. The retaining member 22, with the solder preform 28 secured therein, is positioned between the lower surface of the chip carrier 32 and the opposing upper surface of the circuit board 34, and properly located so that the end portions of each solder preform 28 make contact with the conductive contacts on the chip carrier and the conducting land on the circuit board 34. Means may be provided for orienting the chip carrier 32 relative to the circuit board 34, such as by providing orientation holes 36 in the chip carrier which are vertically aligned with corresponding holes 38 in the circuit board and holes 39 in chip carrier 32 and by inserting pins through the aligned holes. after the soldering process, the ends of the column solder preforms 28 are securely bonded to their respective conductive contacts and lands the chip carrier 32 and the circuit board 34, as shown in FIG. 8.

FIG. 4 illustrates a flat stamped retaining member but, of course, the holder could be formed by stamping, folding or molding into a cup-shaped structure into which the CCP could be accurately placed. Detent features could be provided as pressure-sensitive or hot-melt adhesives could be provided within the retaining member so that the chip carrier could be preassembled to the CCP before application to the PWB. This subassembly could then be located to the PWB using fixtures, pick and place equipment, alignment features such as holes or pins, or the like. Adhesives or pins could be provided in the center surfaces of this retaining member as discussed earlier with respect to FIG. 4 to maintain position during the soldering operation.

FIG. 4 illustrates a single retaining member but, of course, these compounds could conveniently be supplied connected together like a bandboiler for convenient assembly packaging and application.

During the soldering process, it is understood that suitable means will be utilized to maintain good contacts between the conductive elements on the chip carrier 32 and the circuit board 34 until the solder joint has solidified. Techniques for maintaining this contact are known. Another technique for providing this retaining force is shown in FIGS. 9 and 10 and can be incorporated into the retaining member for the solder preforms.

As shown in FIG. 9, an illustrative number of solder preforms 28 are disposed in holes provided in the retaining member 40 which is made from a layer of heat-recoverable material, and each surface is formed with a depression or recess 42. Formation of the recess 42 causes the opposite surface of the retaining member to be raised in a correspondingly-shaped protrusion or bump 44. The elevated planar surface of the protrusion 44 is coated wih a suitable adhesive 46. The recesses 42 and the protrusions 44 can be conveniently formed by a stamping operation in which appropriately-shaped dies are pressed onto the opposed surfaces of the holder 40, causing recesses 42 to be formed in one surface and forcing the material out in the form of protrusion 44 on the other surface, as shown more clearly in the cross-section of FIG. 10.

Once applied between the chip carrier 32 and the circuit board 34, the end portions of each solder preforms 28 make contact with the conductive elements 10 and 12 on the chip carrier and circuit board, and the adhesive 46 on the surfaces of the protrusions 44 make contact, respectively, with the opposed surfaces of the chip carrier and the circuit board, thus holding the chip carrier to the circuit board. During the soldering process, the application of heat causes the heat-recoverable material of the retaining member 40 to recover in a known fashion, causing the recesses 42 and the protrusions 44 to revert to the flat configuration of the retaining member, thus pulling the chip carrier 32 toward the circuit board 34 and causing the solder to wet the contact elements on each respective device.

The shape at the recesses and protrusions shown in FIGS. 9 and 10 are illustrative only; other configurations may be equally suitable. The trapezoidal configuration of the recesses 42 and protrusions 44 shown in the drawings are particularly advantageous in that they provide a relatively large flat surface onto which the adhesive 46 may be applied, and the form of the recesses and protrusions can be easily made in the retaining member 40. In use, the large-area adhesive layers provide a strong gripping force to the respective surfaces of the chip carrier 32 and the circuit board 34, and the contractive force produced by the recovering material of the retaining member 40 exerts sufficient force to pull the chip carrier down toward the circuit board 34. The shapes also aid in venting between chip and board. Obviously, adhesive can be put as well on flat retaining members, without any protrusions, simply to secure the device on the board and the CCP on the device (with or without heat-shrinking) or for vibration damping, etc., as discussed earlier.

Although the solder preforms considered thus far have been of slender cylindrical configurations, other shapes are equally suitable, depending upon the requirements of the mounting. Preforms with sqaure, hexagonal or other shapes of cross-sections can be used.

Furthermore, some examples of other configurations are shown in FIGS. 11A-C, FIG. 12 and FIG. 13. The S-shape of the preforms shown in FIGS. 11A-C provides joints of great flexibility which permit relatively large displacements between the chip carrier 32 and the circuit board 34 without inducing undue stresses in the fixed portions of the joint. With the reverse S-shape preform 48 shown in FIG. 11A, a substantially large contact area is afforded at the upper portions of the preform making contact with the conductive pads 10 and 12 on the chip carrier 32 and the circuit board 34. The preform 48 is supported by two parallel-disposed holder layers 50 and 52.

The S-shaped preform 54 of FIG. 11B affords the same advantages as the preform 48 of FIG. 11A and, additionally, provides two probe areas P and P$^1$ which may be used to test for electrical continuity of the connection. This configuration is particularly advantageous when used in making connections along the periphery of the chip carrier when the contacts are spaced along the edges of the chip carrier inasmuch as the probe area are readily accessible. As with the preform 48, the preform 54 is supported by parallel-disposed retaining member layers 50 and 52. In fabricating the preforms 48 and 54 and positioning them into the retaining members 50 and 52, the preforms are initially straight elements which are inserted into the corresponding, vertically aligned holes in the retaining member layers 50 and 52 and the ends are bent into the configuration shown in FIGS. 11A and 11B.

The S-shaped preform 56 as shown in FIG. 11C is provided in a single retaining member layer 58 having a thickness substantially greater than the individual retaining member layers 50 and 52 shown in FIGS. 11A and 11B. Otherwise, the preform 56 affords the same advantages as the preforms 48 and 54.

The preform 60 shown in FIG. 12 is of C-shape configuration which is suitably attached along the edge of the retaining member 58. Due to its unique configuration the C-shape preforms 60 is most advantageously used when disposed along the peripheral edges of the retaining member 58. The preform 60 provides a very substantial joint surface which may be used to test for electrical continuity between the chip carrier 32 and the circuit board 34.

Although the preforms have been generally described as being made of solder filled with discrete particles or continuous strands, it is within the scope of the invention to make the preforms from a continuous length of conductive material such as wire with filled or unfilled solder material located at the ends thereof for interconnection purposes.

For maximum flexibility and resilience between the chip carrier 32 and the circuit board 34, the coiled spring configuration 62 shown in FIG. 13 is ideal. The preform 62 could be readily formed by extruding the solder composition as a continuous extrudate, forming it onto a coiled configuration of suitable spring material of desired diameter and length, and appropriately supporting each spring preform within the retaining member 58. The degree of resilience afforded by the preform 62 can be controlled in substantially the same fashion that the parameters regulating the performance of conventional springs are controlled, such as controlling the diametric sizes of each turn of the spring, the length of the spring and the diameter of the extrudate from which the spring is made.

Since each solder preform is individually placed in a given location, the preform configuration can be tailored to meet the specific requirements of a particular joint. Thus, for example, the diameter and/or height of the cylindrical preform at certain locations can be different from the preforms at other locations to meet the specific needs of the joint being formed. Conceivably, each joint may be unique and may incorporate a different solder preform. Additionally, it is possible to combine different preform configurations, such as combining the cylindrical preforms with any of the preforms shown in FIGS. 11-13 to meet the specific needs for resilience and stress reduction in one or more particular solder joints.

The interconnection preform placement device of the present invention provides a unique and convenient technique for accurately positioning a plurality of preforms between a chip carrier and a circuit board to which the carrier is mounted. The use of cylindrical column preforms of solder results in solder joints of low bending stiffness and hence low shear stresses, which contribute to high fatigue resistance in the joints. The use of the column-shaped perform in the present invention ensures that the desirable column configurations will be retained during the solderng process and that the formed solder joints will be of column shape having low shear stresses distributed therethrough.

In addition to the embodiment of FIGS. 9 and 10 described above, the interconnection perform placement device may have a layer of pressure-sensitive adhesive on its surfaces, with or without a "release" paper or cover. This adhesive will maintain the device on the circuit board and the chip package on the device during handling prior to the soldering process. The adhesive is applied in such a way as not to interface with the soldering or solder reflow process.

The retaining member may be made of a suitable high-temperature material capable of sustaining the heat applied during the soldering process and be of an electrically insulating material to be left in place after soldering to provide an electrical insulator and an environmental seal. Alternatively, the retaining member may be made of material which is heat-soluble, chemically soluble, or disintegrable such that after soldering the retaining member can be dissolved or disintegrated and removed from the mounting to provide clearance for flux removal, for instance, or for other procedures to complete the installation.

The concepts embodied in the present invention may be adapted for use in attaching a chip to a chip carrier or a chip directly to a circuit board, or to attach leaded CCPs or hybrid thick-film-type chip carriers to circuit boards. Multiple preform placement devices or larger-scale placement devices can accommodate the simultaneous bonding of numerous chip carrier packages. Further, the interconnection preform placement device may be placed between two circuit boards to interconnect vertically the conductive pads of boards.

While preferred embodiments of the invention have been illustrated and described, it will be appreciated that variations therefrom may be made without departing from the scope of the invention as defined in the appended claims.

What is claimed is:

1. A device for providing joint-forming material for forming a connection between two, vertically-spaced electrically-conductive elements, comprising:
    a retaining member which comprises a layer of heat-recoverable material and which has apertures therein; and
    preforms of joint-forming material disposed in the apertures, the preform having a predefined elongated configuration with a height dimension greater than its transverse cross-sectional dimension.

2. A device as in claim 1, wherein the preform is of a slender column configuration.

3. A device as in claim 1, wherein the preform is of an elongatd arcuate configuration.

4. A device as in claim 1, wherein the preform is of a coiled spring configuration.

5. A device as in claim 1, wherein the preform is of solder material.

6. An apparatus as in claim 1, wherein the retaining member comprises a protruding portion disposed on one or more surfaces of the layer.

7. An apparatus as in claim 6, wherein an adhesive layer is disposed on a surface of the protruding portion.

8. An apparatus for providing a plurality of discrete quantities of preformed colulmns of joint-forming material for forming connections between sets of vertically-spaced electrically-conductive elements of an electrical device, each set of conductive elements distributed in a pattern, comprising:
    a dissolvable retaining member having a pattern of apertures homologous with the patterns of conductive elements;
    preforms having a slender column configuration and comprising solder material disposed in the apertures, the preforms having a predefined elongated configuration with a height dimension greater than its transverse cross-sectonal dimension; and
    wherein the preforms extend sufficiently from the surfaces of the retaining member whereby the preforms contact the conductive elements and the retaining member does not contact the conductive elements or the electrical device.

9. An apparatus as in claim 8, wherein the preforms comprise solder material having discrete particles of a material different from the solder disposed within the solder.

10. An apparatus as in claim 9, wherein the discrete particles are aligned with the elongated dimension of the preform.

11. An apparatus as in claim 8, wherein the preforms are of an elongated arcuate configuration.

12. An apparatus as in claim 8, wherein the retaining member comprises a plurality of elements bundled together, each having at least one aperture therethrough for the performs.

13. A method for simultaneously forming a resilient connection between each electrically-conductive element of a first pattern of such elements and each electrically-conductive element of a second pattern of such elements, said first and second patterns of elements being homologous and vertically spaced, comprising:
    providing a preform of connection-forming material between each of said elements on the first and the second patterns of elements such that each preform is associated with an element of the first pattern and the homologous element of the second pattern, the preform having a predefined elongated configuration with a height dimension greater than its transverse cross-sectonal dimension;
    effecting a bond between each preform and the set of conductive elements associated with the preform, each preform maintaining its predefined configuration during the bonding; and
    wherein the providing of the preforms is effected by positioning a retaining member which comprises a layer of heat-recoverable material between the first and the second patterns of conductive elements, the retaining member having a plurality of apertures distributed in a pattern homologous with the pattern of conductive elements, with the preforms being disposed within the apertures.

14. A method as in claim 13, wherein each preform is of a slender column configuration.

15. A method as in claim 14, wherein each preform is of solder material.

16. A method as in claim 13, wherein each preform is of an elongated arcuate configuration.

17. A method as in claim 13, wherein discrete particles of material different from the preform material are disposed within the preform and are aligned with the elongated dimension of the preform.

18. A method as in claim 13, wherein discrete continuous elements of material different from the preform material are disposed within the preform, along the elongated dimension of the preform.

19. A method as in claim 13, wherein the retaining member is a layer having a protruding portion disposed on one or more surfaces of the layer.

20. A method as in claim 19, wherein an adhesive layer is disposed on the surface of the protruding portion, the adhesive layer contacting the support for the patterns of conductive elements.

21. A method as in claim 20, further comprising applying heat to effect the bonding and to cause the protruding portions to recover toward the surfaces of the retaining member to draw the patterns of conductive elements toward the preforms.

22. A method as in claim 13, wherein the retaining member is removed after formation of the connections.

23. A method as in claim 13, wherein the retaining member is of compressible or surface-deformable material.

24. A method as in claim 13, wherein the preforms in the retaining element have different predefined configurations.

25. A method for providing a resilient connection on each electrically-conductive element of a pattern of such elements, comprising:
   providing a preform of connection-forming material in contact with each of said elements on the pattern of elements, the preform having a predefined elongated configuration with a height dimension greater than its transverse cross-sectional dimension;
   effecting a bond between each preform and each conductive elements associated with the preform, each preform maintaining its predefined configuration during the bond; and
   wherein the providing of the preforms is effected by positioning a retaining member which comprises a layer of heat-recoverable material in position relative to the pattern of conductive elments, the retaining member having a plurality of apertures distributed in a patter homologous with the patterns of conductive elements, with the preforms being disposed within the apertures.

26. A method as in claim 25, wherein each preform is of a slender column configuration.

27. A method as in claim 25, wherein each preform is of solder material.

28. A method as in claim 25, wherein each preform is of an elongated arcuate configuration.

29. A method as in claim 25, wherein discrete particles of material different from the preform material are disposed within the preform and are aligned with the elongated dimension of the preform.

30. A method as in claim 25, wherein discrete continuous elements of material different from the preform material are disposed within the preform, along the elongated dimension of the preform.

31. A method as in claim 25, wherein the retaining member is a layer having a protruding portion disposed on one or more surfaces of the layer.

32. A method as in claim 31, wherein an adhesive layer is disposed on the surface of the protruding portion, the adhesive layer contacting the support for the patterns of conductive elements.

33. A method as in claim 31, further comprising applying heat to effect the bonding and to cause the protruding portions to recover toward the surfaces of the retaining member to draw the patterns of conductive elements toward the preforms.

34. A method as in claim 25, wherein the retaining member is removed after formation of the connections.

35. A method as in claim 25, wherein the retaining member is of compressible or surface-deformable material.

36. A method as in claim 25, wherein the preforms in the retaining element have different predefined configurations.

37. A method for providing a resilient connection on each electrically-conductive element of a pattern of such elements of an electrical device, comprising:
   providing a preform having a slender configuration and comprising solder material in contact with each of said elements on the pattern of elements, the preform having a predefined elongated configuration with a height dimension greater than its transverse cross-sectional dimension;
   effecting a bond between each preform and each conductive elements associated with the preform, each preform maintaining its predefined configuration during the bonding; and
   wherein the providing of the preforms is effected by positioning a retaining member which is dissolvable in position relative to the pattern of conductive elements, the retaining member having a plurality of apertures distributed in a pattern homoglous with the patterns of conductive elements, with the preforms being disposed within the apertures and extending from the surfaces of the retaining member whereby the preforms contact the conductive elements and the retaining member does not contact the conductive elements or the electrical device.

38. A method as in claim 37, wherein each preform is of a column configuration.

39. A method as in claim 37, wherein each preform is of an elongated arcuate configuration.

40. A method as in claim 37, wherein discrete particles of material different from the preform material are disposed within the preform and are aligned with the elongated dimension of the preform.

41. A method as in claim 37, wherein discrete continuous elements of material different from the preform material are disposed within the preform, along the elongated dimension of the preform.

42. A method as in claim 37, further comprising applying heat to effect the bonding.

43. A method as in claim 37, wherein the retaining member is removed after formation of the connections.

44. A method as in claim 37, wherein the retaining member is of compressible or surface-deformable material.

45. A method as in claim 37, the preforms in the retaining element have different predefined configurations.

* * * * *